(12) United States Patent
Van Gaasbeck

(10) Patent No.: US 9,711,234 B1
(45) Date of Patent: Jul. 18, 2017

(54) NON-VOLATILE MEMORY READ/WRITE DISTURB MONITORING

(71) Applicant: EMC Corporation, Hopkinton, MA (US)

(72) Inventor: Richard H. Van Gaasbeck, Mountain View, CA (US)

(73) Assignee: EMC IP Holding Co., LLC, Hopkinton, MA (US)

( * ) Notice: Subject to any disclaimer, the term of this patent is extended or adjusted under 35 U.S.C. 154(b) by 0 days.

(21) Appl. No.: 15/072,981

(22) Filed: Mar. 17, 2016

(51) Int. Cl.
  *G06F 12/02* (2006.01)
  *G11C 16/34* (2006.01)
  *G11C 16/10* (2006.01)
  *G11C 16/26* (2006.01)

(52) U.S. Cl.
  CPC .......... *G11C 16/3431* (2013.01); *G11C 16/10* (2013.01); *G11C 16/26* (2013.01)

(58) Field of Classification Search
  CPC ...... G11C 16/3431; G11C 16/10; G11C 16/26
  USPC ..................................................... 365/185.02
  See application file for complete search history.

(56) References Cited

U.S. PATENT DOCUMENTS

| | | | |
|---|---|---|---|
| 8,599,609 B2* | 12/2013 | Franca-Neto | G06F 11/1048 365/185.02 |
| 2012/0166707 A1* | 6/2012 | Franca-Neto | G06F 11/1048 711/103 |
| 2013/0176778 A1* | 7/2013 | Chen | G11C 16/06 365/185.03 |
| 2014/0146609 A1* | 5/2014 | Avila | G06F 11/106 365/185.17 |

* cited by examiner

*Primary Examiner* — Vanthu Nguyen
*Assistant Examiner* — Xiaochun L Chen
(74) *Attorney, Agent, or Firm* — Barry N. Young

(57) ABSTRACT

A non-volatile memory has multi-level arrays of write-in place memory cells that are subject to change over time because of read and write disturbs. Disturb count counters of each read cell and each cell surrounding a written target cell are incremented by different scaling factors that reflect the effect of the disturbs on each such cell. Upon a counter reaching a predetermined threshold, a refresh of the cell is initiated.

14 Claims, 3 Drawing Sheets

NON-VOLATILE MEMORY READ/WRITE DISTURB MONITORING

BACKGROUND

This invention relates generally to non-volatile memory management, and more particularly to the monitoring of read and write disturbs on memory cells of non-volatile memory for refresh of the cells to prevent data loss.

An ideal memory system is fast, cheap, persistent and large (highly dense). Dynamic random access memory (DRAM) is fast and cheap, but is not persistent. Non-volatile memory (NVM) is persistent memory that is characterized by its ability to retain a memory state in the absence of applied power, and advances in NVM technologies have significantly improved its speed, density and cost. The most common type of silicon-based semiconductor NVM is Flash memory which stores data as charge on the floating gate of a MOSFET device and can be electrically erased. The charge on the floating gate essentially blocks current flow through the device. Flash is widely used for portable Flash drive devices and is increasingly being used in solid state drives (SSDs) as replacements for rotating magnetic disk drive memories. Flash memory, however, has some drawbacks over DRAM. It cannot be updated in-place—a whole block must be erased before it can be reprogrammed. There are, however, many other types of NVM which have been developed or which are under development that can be written in-place. These include, for instance, magnetoresistive random access memory (MRAM) which stores data in a magnetic storage element, spin-transfer torque (SST) random access memory based upon the orientation of the spin of a magnetic layer, and phase change memory (PCM) which is based upon a reversible phase conversion between the amorphous and crystalline states of a chalcogenide glass due to heat caused by the passage of current through the material, to name a few.

Although NVM locations are non-volatile, their states are persistent but not permanent—they may change over time. NVM storage elements (target locations) are written and read using electrical current. Writing typically uses a much larger current than reading. When a target location is read, it is disturbed and can slightly change its state. After the location is read many times, its data value becomes unreliable and the location can actually flip values. This is well known as a "read disturb". When a target location is written, it is not disturbed because a new value is written to the location. However, other locations (victim locations) that are physically close to the target location that was written may be disturbed, and over time they can also flip values. As NVM media becomes more dense, memory locations (cells) become closer together, and memory cells may be stacked in layers. Accordingly, the memory cells can be more affected by write disturbs.

In order to maintain an acceptably low error rate, the data in a memory cell needs to be refreshed when the number of disturbs becomes too high. Depending upon the type of NVM, the data can be refreshed by either rewriting it in-place, or moving it to another location. One possible way of determining when a particular memory location (cell) needs to be refreshed is by counting the number of reads and writes to each location, periodically scanning all counters, and combining the read disturb influences on the target location and the surrounding write disturb influences to decide whether to refresh the location. There are several disadvantages with this approach. One is that memory bandwidth is wasted as every location's counters must be checked during each asynchronous counter sweep regardless of whether a location has been disturbed or not. Another disadvantage is that a memory location may experience several disturbances between asynchronous sweeps, and may be disturbed beyond its ability to reliably retain data before it can be refreshed. Thus, the data may be lost.

It is desirable to provide new and improved approaches for monitoring disturbs to memory locations of NVM that address the foregoing and other disadvantages of known approaches, and it is to these ends that the present invention is directed.

DESCRIPTION OF PREFERRED EMBODIMENTS

The invention is particularly well adapted to monitoring write in-place non-volatile memory that is somewhat similar to Flash memory, and will be described in that environment. As will become evident, however, this is illustrative of only one utility of the invention, and the invention may be used with other types of memories.

Figure 1:
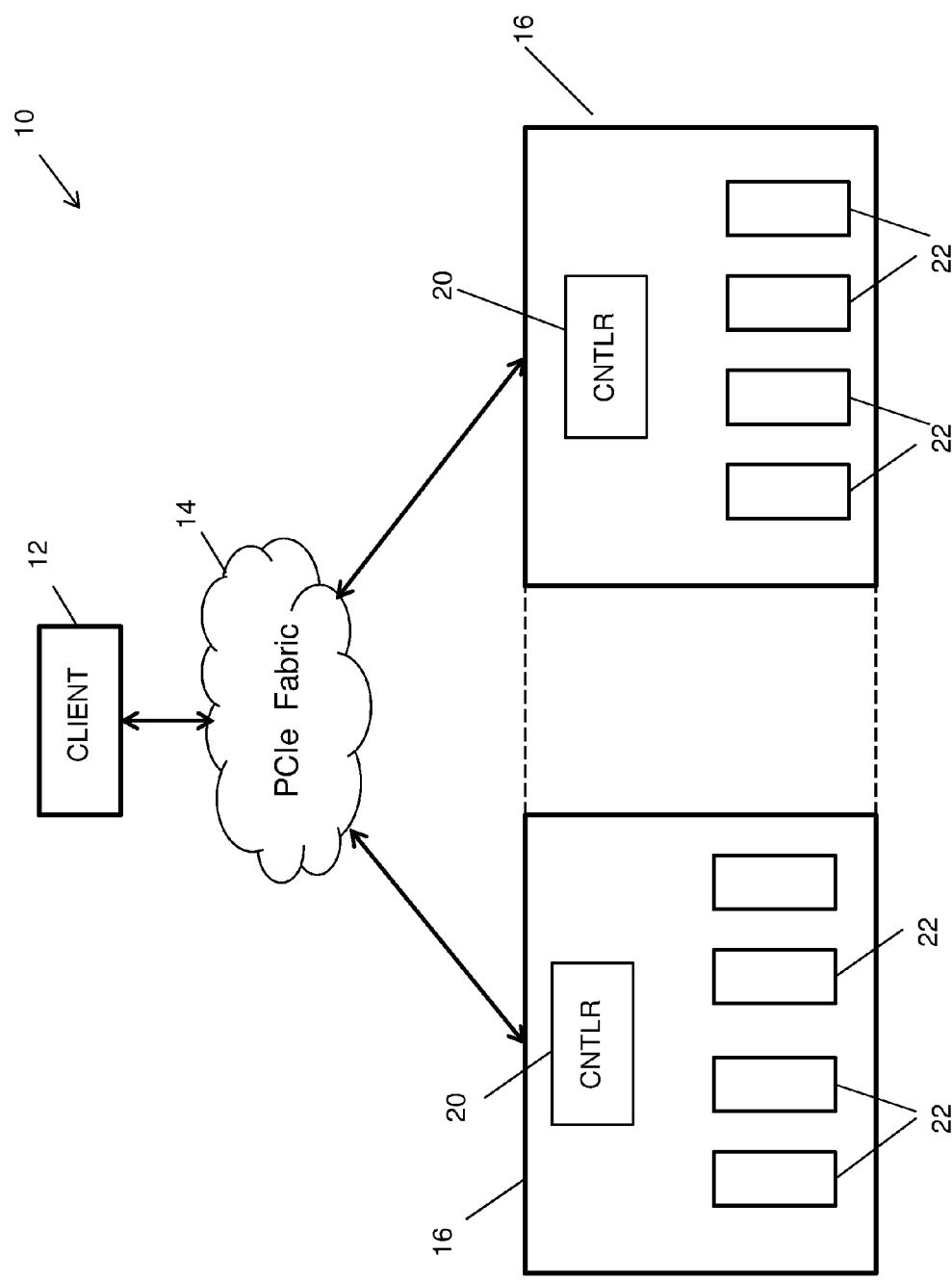
FIG. 1 is a block diagram of a non-volatile memory system of the type with which the invention may be employed.

FIG. 1 illustrates one type of a non-volatile computer memory system 10 with which the invention may be used. The memory system may comprise a client computer 12 connected by an interface, such as a peripheral component interconnect express (PCIe) fabric 14, to a plurality of non-volatile memory modules 16, two such modules being shown in the figure. Each memory module may have a plurality of non-volatile memory units 22, and a controller 20 comprising a microprocessor and associated memory such as DRAM and program memory storing computer readable instructions for controlling the microprocessor to perform the operations described herein. The memory units may each comprise arrays of random access non-volatile memory (NVM) cells that store data values without the necessity of electrical power to retain the values. In different embodiments, the NVM cells may be any of a plurality of different types of NVM, such as MRAM, PCM, etc., which are written and read by the controllers 20 operating in response to commands from client 14. In a preferred embodiment, the memory units may comprise three-dimensional, multi-layer arrays of write in-place non-volatile memory cells such as shown and described below in FIG. 2.

Figure 2:
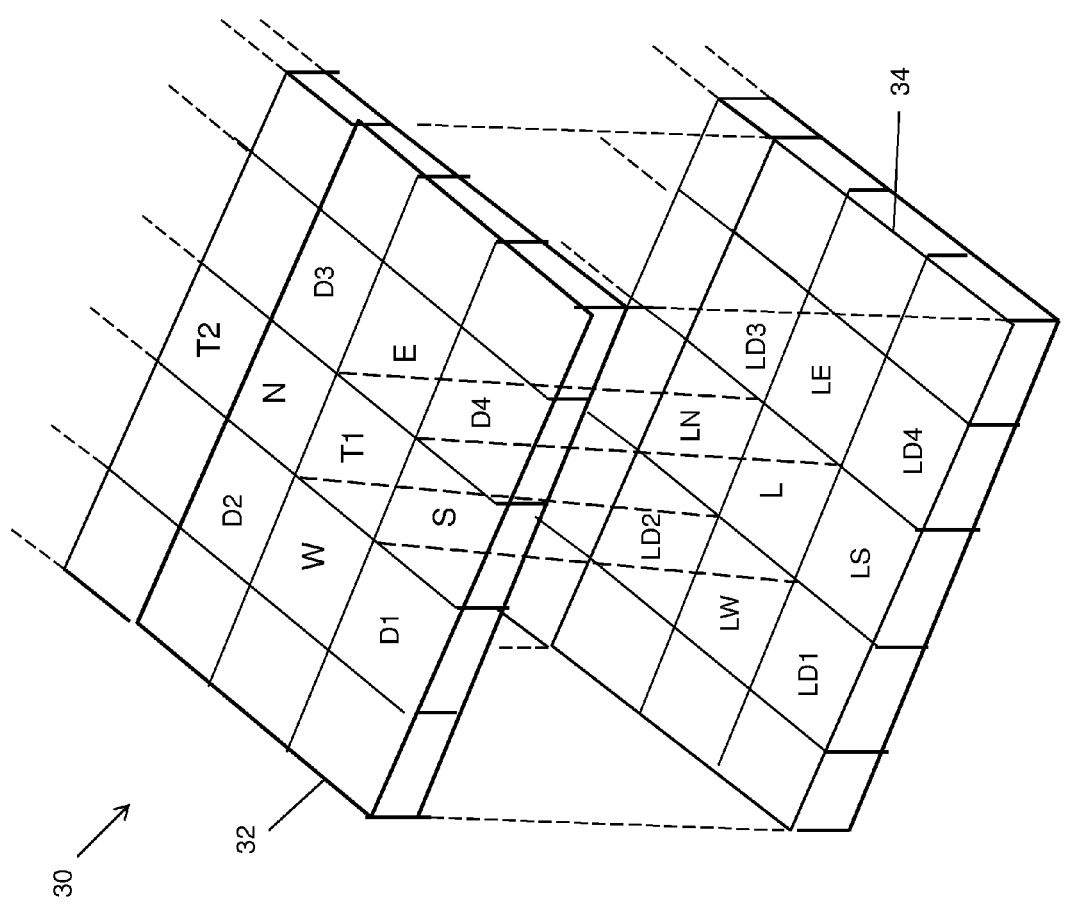
FIG. 2 is an exploded diagrammatic view of a portion of an embodiment of a two-layer write in-place non-volatile three-dimensional memory with which the invention may be used.

FIG. 2 is an exploded diagrammatic view of a portion of an embodiment of a three-dimensional write in-place non-volatile memory 30 with which the invention may be used. In the embodiment shown in the figure, memory 30 is a two-layer memory comprising a top planar array 32 of memory cells and a lower planar array 34 of memory cells. In other embodiments, there may be fewer or more memory array layers. The top and lower planar arrays may have the same geometry and be physically stacked upon one another to form part of a memory unit 22 of a memory module 16.

Each memory cell of an array layer may be the same type of write in-place NVM that contains a data value. Although all of the cells of an array are illustrated in the figure as being the same shape and size arranged in a grid array, the cells may have different dimensions and geometries. Each memory cell of an array may be randomly and independently written in-place or updated to change its data value, and each cell may be randomly read.

As described above, the cells of the memory 30 are subject to read and write disturbances (disturbs) that over time can change their stored data values. Reads in an NVM are like mini-writes. Each time a target cell is read, its memory state is disturbed slightly, and over time the state of the cell and its corresponding data value can change due to such disturbances. Depending upon the type of NVM, the threshold number of read disturbs at which a target cell is susceptible to change states may be of the order of tens of thousands to millions. In order to prevent data loss, the data value of the target cell needs to be refreshed, e.g., rewritten, before the number of disturbs reaches the limit where the cell changes state. Typically, read disturbs affect only the target cell being read, not any of its surrounding cells. Writes, however, to target cells cause write disturbs to neighboring "victim" cells of the target cell being written. Such write disturbs over time can cause the neighboring victim cells also to change their states and result in data values being lost. The effect of a write disturb on neighboring victim cells may differ considerably depending upon various factors, such as the type of non-volatile memory, the geometry of the memory, the location of the victim cell relative to the written target cell, etc. As described below, the invention takes into account the effects on a given victim cell of different disturbs in determining when to refresh the victim cell.

For example, in the memory 30 of FIG. 2, a write to target cell T1 in the top layer 32 disturbs at least five victim cells, i.e., the four adjacent cells N (north), E (east), S (south) and W (west) in the top layer surrounding the target cell T1, and the lower cell (L) of the lower layer 34 that lies directly beneath target cell T1. The write to T1 may also disturb other neighboring cells, such as, for example, cells D1, D2, D3 and D4 located diagonally to T1 in upper layer 32, and possibly cells LN, LE, LS and LW in the lower layer 34 neighboring cell L, and cells LD1, LD2, LD3, and LD4 in the lower level diagonal to cell L, among others. Moreover, since write disturbs are reciprocal, a write to cell L in the lower layer 34 would disturb cell T1 in the upper layer and possibly its neighboring and diagonal cells. Similarly, a write to target cell T2 in the top layer would also disturb the adjacent N cell, as well as other neighboring cells of T2 including cells D2 and D3. If the memory 30 had a third upper layer of memory cells above layer 32, the write to target T1 would also disturb a memory cell ("U", not shown) in that third upper layer directly above target cell T1. In some embodiments of a multi-layer memory, other memory cells in the lower and upper layers could also possibly be disturbed by a write to target T1. To avoid data loss, it is necessary to take into account the degree of disturbances experienced by a victim memory cell, and refresh the cell before the disturbances reach a limit where the cell changes states.

Typically, the number of write disturbs required to reach a limit number where a victim cell changes states is substantially fewer than the number of read disturbs required for that same cell to change states. The threshold limit for the number of disturbs experienced by a particular victim cell to cause a state change depends upon the accumulated effect of multiple disturbs to the victim cell. These effects depend upon a number of different factors, such as the type and geometry of the memory, and the location of the victim cell relative to target cells that were written. Writes do not disturb the target cell that was written since a write changes the state of the memory cell to a new state representative of the data value written, similar to an update of a data value in the cell, but they disturb neighboring victim cells.

The invention does not count the number of reads and writes to each memory cell as is conventionally done in order to determine when to refresh the cell. Rather, the invention takes into account the accumulated effect of multiple different disturbances to a cell caused by reads and writes to the memory in determining when to refresh a cell. As will be described below, in accordance with one embodiment of the invention, the number of disturbs on a victim cell at a particular memory location produced by reads and writes to the memory may be accumulated in a counter for that cell, where each disturb is weighted by a scale factor that takes into account differences in effect on the victim cell caused by the differences in the locations of the target cells that produced the disturbs on that victim cell, and the count for each disturb is adjusted by the appropriate scale factor. For a read, a disturb is counted for only the cell that was read. As will be described, the amount of disturbance experienced by a victim cell due to writing of a neighboring target cell may be quite different depending upon the location of that target cell relative to the victim cell, and this is taken onto account in determining the appropriate time to refresh the victim cell. Additionally, rather than periodically asynchronously scanning the counters of all cells in a memory, in accordance with the invention, after a read or write operation the updated cell counter of each victim cell may be compared to a threshold to determine whether a refresh limit for that cell has been reached. After a read, the read victim's counter may be checked. Upon a write, the five (or more) neighboring victim cells counters in the same layer and in adjacent layers may be incremented according to the appropriate scale factors for the disturb effect caused to a victim cell by the write to the target cell, and the accumulated counts checked. If the threshold limit of any counter is exceeded, the data for the associated cell may be refreshed immediately or the cell may be added to a refresh queue and refreshed as part of a larger operation, as will be described. This improves over the conventional asynchronous approach by reducing the memory bandwidth previously required because locations are not checked that could not be over their limits. Moreover, since data may be refreshed substantially immediately when a cell's count reached the preset threshold limit, by including an appropriate safety margin in the threshold the possibility of disturbing the cell to the extent that it loses data before it can be refreshed is minimized.

Another significant difference with the invention, as indicated above and as will be described, is that the invention takes into account the effects of different factors, such as cell type, cell location, memory geometry, and type of memory operation in determining when a cell reaches a threshold limit that necessitates a data refresh. The differences in effect to a victim cell for different writes may be reflected in the weighting or scale factor applied for the count for the disturb. In a preferred embodiment, the controller 20 of each memory module 16 may provide disturb counters for its associated memory units 22, and the controller may combine counts for read and write disturbs to a particular victim cell in a single disturb counter for that cell by using a scaling or weighting factor for each disturb caused by memory writing operations on neighboring target cells to determine the count that should be added to the counter for each write based upon the degree of disturbance to the victim cell caused by such write. The count in that single counter can be compared to single threshold limit to determine when to refresh the cell. For instance, assume that a cell is disturbed sufficiently such that there is a possibility of data loss after 10,000 reads. Assume further that because of the geometry, type of memory, and other factors, it requires 5,000 above, U, or below, L, writes to disturb the cell to the same degree as a read, 2,000 N or S writes to disturb the cell the same amount, and 1,000 E or W writes to disturb the cell an equivalent amount sufficient to cause a possible state change. A scaling factor of 1 may be applied to a read of a cell so that a count of 1 is recorded in that cell's counter. For writes, a scaling factor of 2 (a ratio of 10,000/5,000) may be applied to the U and L counters upon a write to the target cell T1 and vice versa to the counter of T1 for a write to either the U or L cells. Other appropriate scaling factors may be applied for writes to diagonal cells. (Scaling is also reciprocal so that a write to either of the U or L cells would increment the counter of target cell T1 by 2.) A scaling factor of 5 may be applied for N and S writes; and a scaling factor of 10 may be applied for E and W writes. In other words, a write produces twice the disturbance to U and L victim cells (or vice versa), five times the disturbance to N and S victim cells, and ten times the disturbance to E and W cells as does a read. This example assumes that victim cells symmetrically located relative to a target cell experience the same disturbances. In other cases, this may not be true, in which case a unique scaling factor may be applied for the disturbances caused by or to each different cell. The controllers 20 of the memory modules 16 may maintain memory maps that identify the neighboring cells of each memory cell and their associated scaling factors.

Based upon the above example, when a cell counter reaches a threshold count of 10,000, for example, a refresh of the cell may be initiated. As mentioned, the threshold may be set to provide a desired safety factor to insure that a cell does not change states due to reads or writes before it can be refreshed. The scaling factors for disturbances may be determined based upon empirical data by measuring the effects of disturbs on a cell due to read or write operations on other cells in its vicinity. As indicated, there may be a certain, e.g., linear, relationship of disturbance influences based upon locations of memory cells. However, other approaches to scaling may be appropriate for particular memory arrays based upon other criteria such as geometry, etc., and these may also be used to establish scaling factors. The use of a single counter and scaling of counts for different disturbs saves memory space and simplifies the limit checking for refresh. As may be appreciated, other scaling approaches may also be used. Preferably, the counter itself initiates a refresh operation of the cell or, alternatively, adds the cell to the refresh queue upon the counter reaching the predetermined threshold limit, thereby obviating the necessity of scanning the counters to find ones that have reached the threshold. Upon refresh of a cell, its corresponding counter is reset to zero to begin accumulating new disturb counts.

Figure 3:
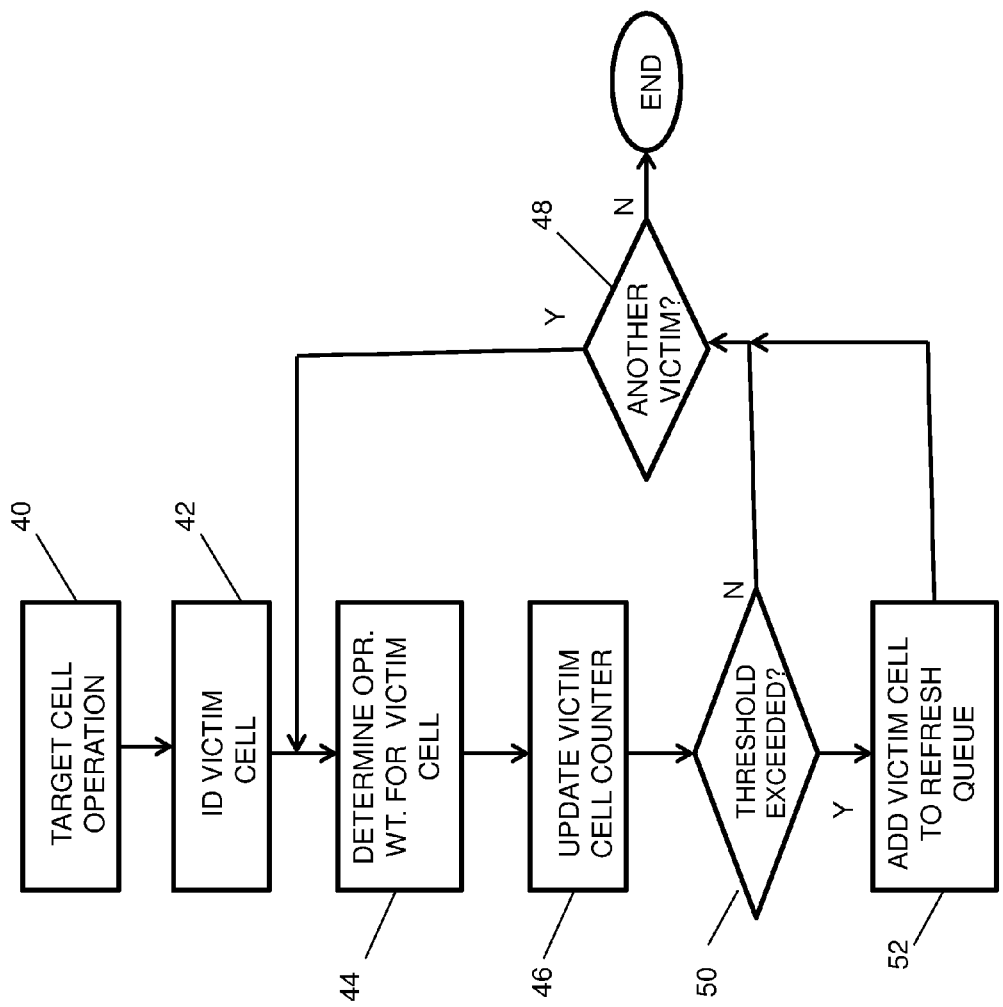
FIG. 3 is a diagrammatic view of a workflow method in accordance with the invention for monitoring memory cells of a non-volatile memory to determine when the cells should be refreshed to prevent data loss due to disturbs.

FIG. 3 is a diagrammatic view of an algorithmic method in accordance with an embodiment of the invention that may be performed by a controller of a memory unit for monitoring a NVM such as shown in FIG. 2 to determine when a refresh of a cell is necessary. Referring to the figure, at step 40 an operation on a target memory cell is detected, and at step 42 a victim cell that was disturbed by the operation is identified. If the operation was a read operation, the only victim cell may be the target cell itself that was read. If, however, the memory operation was a write, victim cells may be only the five neighboring cells (N, S, E, W, U or L) in the two-layer memory 30 (or six neighboring cells including both a U and a L cell if the memory was a three-layer memory). In other instances, victim cells may be two or more cells away from a target cell write, and the effects on these victim cells may be taken into account by appropriate scaling factors. At step 44, the weight or scaling factor assigned to a first victim cell is determined, and at step 46, an associated counter of the first victim cell is updated (incremented) by adding to a current count of the counter a new count determined by the appropriate scaling factor applicable to that selected first victim cell. For instance, upon a write to target cell T1 of the memory 30 of FIG. 2, the counters of N and S are incremented by 5, and the counts of the counters of the E, W, U and L cells, as applicable, are incremented by their appropriate scaling factors. As noted, a scaling factor takes into account the disturbance to its associated victim cell based, for example, upon nature of the disturbance that impacts that victim cell.

After the counter is updated for the selected victim cell at 46, the process may determine at step 50 whether the predetermined threshold level of disturbs for that victim cell as determined by that victim cell's counter has been exceeded. If so, at step 52 the victim cell may be added to a refresh queue, or alternatively, refreshed immediately. At step 50 if the threshold is not exceeded, the process may determine at 48 whether there is another victim cell. If not the process ends. If there is another victim, the method loops back to step 44 and repeats until there are no further victim cells that were identified, at which time it ends.

More generally, the steps of the foregoing method for incrementing cell counters to determine when to refresh a cell may be expressed as follows:

For a write:
1. disturb[target]=0
2. disturb[north_victim(target)]+=north_weight
3. disturb[south_victim(target)]+=south_weight
4. disturb[east_victim(target)]+=east_weight
5. disturb[west_victim(target)]+=west_weight
6. disturb[above_below_victim(target)]+=above_below_weight
7. if any of N, W, E, W, above/below is >thresh, then queue refresh request For a read:
1. disturb[target]+=read_weight
2. if disturb[target]>thesh, then queue refresh request The interpretation of these steps is as follows. For a write operation, at step 1 the disturb counter of the target is not incremented (update equals zero), since a write does not disturb the target. At step 2, the disturb counter for victim cell north (N) of the target cell is updated by incrementing the current count of the N cell counter by count equal to the scale factor (weight), e.g., 5. This is repeated at steps 3-6 by incrementing the current counts in the counters for the victim cells S, E, W, and U or L by counts corresponding to the corresponding scale factors for these victim cells. At step 7, if any counter exceeds the threshold, the cell is queued for a refresh. A read operation is similar, except only the target cell is incremented by the scale factor before comparing its counter to the threshold.

Since refreshing a cell involves rewriting the data to the cell, a refresh also caused disturbs to neighboring cells, and it is possible that a refresh of one victim cell causes another adjacent victim cell to reach its threshold limit requiring that it be refreshed also. Thus, it is desirable to organize the refresh queue so that victim cells are refreshed in an optimal order that avoids the need for redundant refreshes. This may be accomplished, for example, by sorting the order of cell refreshes by location, eliminating duplicate refresh requests, and organizing refresh requests in the queue in a way that optimizes the order in which refreshes are done.

A further refinement is to organize the counters in the memory of the controllers such that target and victim cell counters are close to one another. This allows an update to fit in fewer cache lines, or to reference fewer DRAM pages. The foregoing description of the invention has been in the context of maintaining a counter for each cell, and monitoring the count relative to a threshold to determine when to refresh that cell. This has been convenient for describing the invention and the disturbances to NVM locations caused by reads to that location and writes to neighboring locations.

The foregoing has also described the invention in the context of a single level cell (SLC) memory, where cells can only have two possible values, 0 or 1. In a SLC memory, a cell stores only a single bit of a data value, whereas the complete data value in reality comprises multiple bits, e.g., 8 bit words, that are stored in multiple cells. Therefore, reading or writing a data value comprises reading or writing multiple cells together. Moreover, in some applications, data may be read or written in multiple bytes, such as 16 bytes of 8 bit words comprising 128 bits, or even in 4K or more byte blocks corresponding to 32,768 single level cells. Each write to a cell can disturb five or more other cells. In such cases, it is inefficient to maintain a separate counter for each cell. Rather, in accordance with the invention, a more efficient approach is to maintain a counter for groups or blocks of cells, e.g., 4 K bytes, and to refresh all cells of the group when the group cell counter for the group reaches a predetermined threshold. Thus, the invention may maintain information on the organization of the memory to facilitate defining and monitoring blocks of cells.

Multi-level cell (MLC) technologies also exist where a memory cell can have four or eight values per cell. In this type of memory, the amount of disturb to victim cells may depend upon the differences between a present value and a new value of the target cell. For instance, it may disturb neighbors more to write the target cell from a 0 to a 7 than it does to write from a 0 to a 3. These differences in disturbs to neighbors may likewise be taken into account using appropriate scaling factors.

While the foregoing has been with reference to preferred embodiments, it will be appreciated by those skilled in the art that changes to these embodiments may be made without departing from the principles and spirit of the invention, the scope of which is defined by the appended claims.

The invention claimed is:

1. A method of managing a non-volatile memory that includes an array of a plurality of non-volatile memory cells that can be individually written and read, the cells being subject to read and write disturbs that over time can cause a change of a cell state and a data value stored by the cell, comprising:
    accumulating counts of read and write disturbs experienced by a victim cell of the array;
    applying a scaling factor to each count of a write disturb that is experienced by the victim cell due to a write of a target cell located in the array in the vicinity of the victim cell, where the scaling factor changes a unit count number that is accumulated for said each count by an amount that is based upon the effect of the write disturb on the victim cell due to the location of the victim cell relative to said target cell; and
    refreshing a data value stored by the victim cell upon the accumulated count of disturbs to the victim cell reaching a predetermined threshold.

2. The method of claim 1, wherein said unit count number corresponds to the effect of a read disturb to said victim cell, and said applying comprises applying a scaling factor value that increases said each count by a number corresponding to the effect of said write disturb on said victim cell.

3. The method of claim 1, wherein said applying comprises applying different scaling factors to counts for write disturbs to said victim cell attributed to writes to different neighboring target cells, said different scaling factors having values that depend upon the locations of said different neighboring target cells relative to said victim cell.

4. The method of claim 3, wherein the scaling factors have the same value for write disturbs to said victim cell that are caused by writes to target cells that are symmetrically located relative to said victim cell.

5. The method of claim 3, wherein said memory comprises a plurality of planar layers of cells, which layers are stacked upon one another, and wherein said scaling factors have the same value for write disturbs to said victim cell that are caused by writes to target cells located above or below said victim cell in said layers.

6. The method of claim 3, wherein the effects of said disturbs and said scaling factor values are determined by the type of non-volatile memory cells and by the geometry of said memory.

7. The method of claim 1 further comprising a counter associated with said victim cell in which said counts due to said disturbs experienced by said victim cell are accumulated, and wherein said refreshing of said victim cell is initiated by said counter upon accumulating a count corresponding to said predetermined threshold.

8. The method of claim 1, wherein said refreshing comprised adding said victim cell to a refresh queue with other cells needing refresh, and refreshing the cells in said refresh queue in an order that avoids the need for duplicate refreshes of a cell due to an accumulated count for such cell reaching said threshold because of refreshes to neighboring cells.

9. A method of managing a non-volatile memory that includes an array of a plurality of non-volatile memory cells that can be individually written and read, the cells being subject to read and write disturbs that over time can cause a change of a cell state and a corresponding change of a data value stored by the cell, comprising:
    performing a write operation on a target cell of said array;
    identifying a victim cell of said array in the vicinity of said target cell that is subject to a write disturb due to said write operation on said target cell;
    determining a scaling factor that reflects the effect of said write disturb to said victim cell due to said write operation, the scaling factor having a value that is greater than a unit value of a read disturb on said victim cell by an amount determined by a location in said array of the target cell relative to said victim cell;
    incrementing a counter of disturb counts associated with said victim cell in response to said write disturb by a count determined by said scaling factor;
    detecting whether an accumulated count of said counter exceeds a predetermined threshold; and
    initiating, upon said accumulated count exceeding said predetermined threshold, a refresh of a data value of said victim cell to prevent a loss of data due to said victim cell changing states.

10. The method of claim 9, wherein the method further comprises identifying another victim cell in the vicinity of said target cell, and repeating said determining, said incrementing, said detecting and said initiating steps for said other victim cell.

11. The method of claim 10 further comprising identifying all neighboring cells to said target cell, and repeating said determining, said incrementing, said detecting and said initiating steps for all of said neighboring cells.

12. The method of claim 9, wherein said initiating comprises adding said victim cell to a refresh queue, and refreshing the victim cell in said refresh queue prior to the victim cell being disturbed sufficiently to cause the victim cell to change data values.

13. A memory system having memory modules, each memory comprising:
- a plurality of non-volatile memory cells that can be individually read and written by read and write operations, respectively, the cells being subject to read and write disturbs that over time can cause a change of state of said cells and a corresponding change in a data value of such cells;
- a controller comprising a microprocessor for controlling writing and reading of said memory cells, the controller having a program memory for storing executable instructions for controlling the operation of said controller and providing counters associated with cells of said array for accumulating counts of read and write disturbs experienced by said cells, the executable instructions controlling said controller to:
  - identify a victim cell that is disturbed by a write operation;
  - select a scaling factor that reflects the effects of a disturb to said victim cell due to a write operation to a target cell of said array in the vicinity of said victim cell, said scaling factor having a value that is greater than a unit value of a read disturb on said victim cell by an amount based upon said effect of said write disturb as determined by a location in said array of said target cell relative to said victim cell;
  - increment a counter of disturbs associated with said victim cell in response to a write disturb by an amount determined by said selected scaling factor for said victim cell;
  - detect whether an accumulated count of said counter exceeds a predetermined threshold; and
  - initiate, upon said accumulated count exceeding said predetermined threshold, a refresh of a data value of said victim cell to prevent a loss of data due to said victim cell changing states.

14. The memory system of claim 13, wherein said plurality of said cells are arranged in multi-layer planar arrays, and said controller identifies neighboring cells to a target cell that is written as victim cells, and increments the counters associated with each of said neighboring victim cells by a selected scaling factor applicable to each such victim cell as determined by the locations of said victim cells relative to said target cell.

* * * * *